United States Patent
Mazurowski et al.

[11] Patent Number: 6,107,630
[45] Date of Patent: Aug. 22, 2000

[54] ARRAY COMBINING MANY PHOTOCONDUCTIVE DETECTORS IN A COMPACT PACKAGE

[75] Inventors: John S. Mazurowski, Indiana; John S. Griffith, Ebensburg; Robert D. Norman, Clymer, all of Pa.

[73] Assignee: Diasense, Inc., Pittsburgh, Pa.

[21] Appl. No.: 09/077,781

[22] PCT Filed: Dec. 6, 1996

[86] PCT No.: PCT/US96/19799

§ 371 Date: Jan. 27, 1998

§ 102(e) Date: Jan. 27, 1998

[87] PCT Pub. No.: WO97/21080

PCT Pub. Date: Jun. 12, 1997

Related U.S. Application Data

[60] Provisional application No. 60/008,340, Dec. 7, 1996.

[51] Int. Cl.[7] ........................................ G01J 5/14
[52] U.S. Cl. ................................ 250/338.4; 250/336.1; 250/339.02; 250/339.03; 250/352
[58] Field of Search ........................................ 250/352, 349, 250/338.4, 336.1, 390.01, 339.02, 339.03, 394

[56] References Cited

U.S. PATENT DOCUMENTS

| | | | |
|---|---|---|---|
| 4,225,786 | 9/1980 | Perlman | 250/342 |
| 5,296,710 | 3/1994 | Ohno et al. | 250/352 |
| 5,391,875 | 2/1995 | Cederberg et al. | |
| 5,914,488 | 6/1999 | Sone | 250/338.1 |

*Primary Examiner*—Constantine Hannaher
*Assistant Examiner*—Otilia Gabor
*Attorney, Agent, or Firm*—Webb Ziesenheim Logsdon Orkin & Hanson, P.C.

[57] ABSTRACT

A radiation detector includes a plurality of detector elements arranged on a detector substrate in an interdigitated linear array. A thermoelectric or other cooler is attached to the lower surface of the detector substrate. A pair of interconnect boards is positioned on opposite sides of the detector substrate. The detector elements, substrate, cooler and pair of boards are received in a sealed housing and a radiation transmitting window in the housing permits radiation to pass into the housing and strike the detector elements. A plurality of conductive pins extends through the housing and terminates at electrical traces on the interconnect boards. A thermistor or other temperature sensor is attached to the detector substrate and, through control of the thermoelectric cooler, maintains the detector substrate at a desired operating temperature.

13 Claims, 1 Drawing Sheet

ARRAY COMBINING MANY PHOTOCONDUCTIVE DETECTORS IN A COMPACT PACKAGE

CROSS REFERENCE TO RELATED APPLICATIONS

This application is the national stage of International Application No. PCT/US96/19799, filed Dec. 6, 1999, and claims priority from U.S. Provisional Patent Application Serial No. 60/008,340, filed Dec. 7, 1996, entitled "Array combining Many Photoconductive Detectors in a Compact Package".

BACKGROUND OF THE INVENTION

1. Field of the Invention

This invention relates to detectors and, more particularly, to an array of photoconductive detectors.

2. Background Art

The use of photoconductive detectors for measuring radiation is well known. Because of their high sensitivity, photoconductive detectors such as PbS and PbSe are particularly effective in measuring infrared radiation. Detection of infrared radiation is used by the military for tracking warm vehicles and in night vision devices, is used by medical instrument manufacturers for measuring glucose and other body constituents in a noninvasive manner and is used by scientific instrument manufacturers for measuring chemical composition and structure.

In general, the resistance of the photoconductive detector changes when the radiation falls on its surface. Resistance changes can be measured as an electrical signal change and the intensity of the detected radiation can be estimated by the magnitude of resistance change.

Photoconductive detectors typically require a bias current or voltage to operate, such as a direct current bias. The sensitivity of the detector is proportional to the magnitude of the applied bias. It is preferred to supply a high bias to such a detector to increase its sensitivity and to overcome the noise of the electronics associated with the detector in an overall detection system.

It is common to use a plurality of photoconductive detector elements, also referred to as pixels, in the form of a linear array mounted on a common substrate to measure radiation across a spectrum of wavelengths. Each detector element is responsive to and detects a particular wavelength, or band of wavelengths, of radiation. In applications such as infrared scanners and cameras, it is a goal to integrate many photoconductive detector elements and their associated electronics into a single compact package.

It is an object of the present invention to provide a radiation detector which includes an array of photoconductive detector elements in which the performance of individual detector elements is alike. It is a further object to provide stability to the overall detector array both in terms of atmosphere and temperature stability, as well as in mechanical stability, and in an arrangement which is less complicated to manufacture than prior devices.

SUMMARY OF THE INVENTION

The present invention is a packaged linear array of detector elements which are particularly suitable for noninvasive tissue constituent measurement using infrared radiation. The dimensions of the individual detector elements should be chosen such that their size and spacing presents an electrical signal output that is usable and is relevant to the desired radiation or optical data. The preferred semiconducting material chosen for the photodetector elements is optimized for the best spectral response, signal quality and noise output for measurement of radiation signals from tissue constituents.

The packaging of the large group of detector elements in accordance with the present invention is unique and accomplishes several objects. The detector elements are interdigitated in such a way that adjacent detector elements face opposite directions. This design allows the array assembly to be manufactured in a more compact arrangement. In addition, the spacing between the individual detector signal connections can be increased to 2.54 mm or 0.1 inch or more by using one wire bond, one trace and one solder connection per detector element. Such a configuration significantly reduces the cost of the overall system.

In order to avoid contamination of the detector elements in the array, a package surrounding the detector array and associated electronics uses materials and construction to yield a high reliability seal. A window which allows radiation to impinge upon the detector array is chosen so as to not degrade the radiation's ability to reach the detector elements. The substrate carrying the array of detector elements is cooled by a thermoelectric cooler or the like, with temperature sensing feedback, such as through a thermistor, used to maintain precise and uniform temperature control of the array. The mechanical design of the package can be used to enable the detector elements to be precisely aligned by using physical features machined into the external package.

DESCRIPTION OF THE PREFERRED EMBODIMENTS

Figure 1:
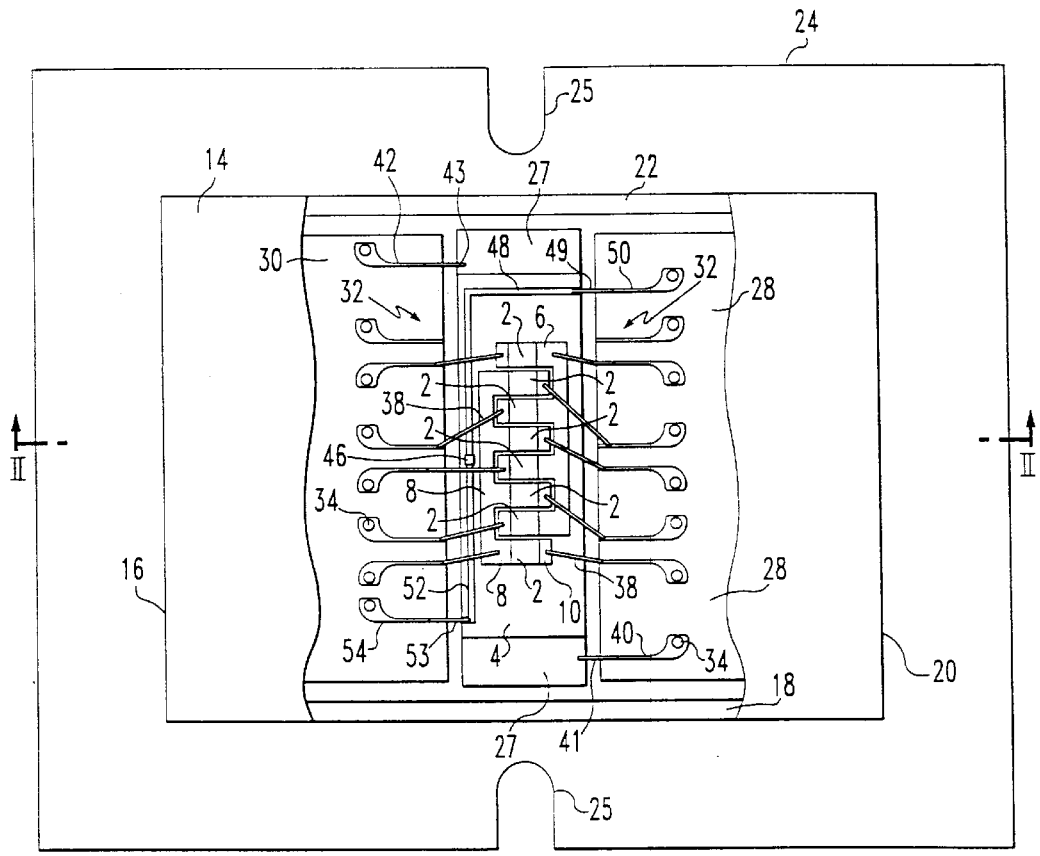
FIG. 1 is a top view, partially broken away, of a radiation detector in accordance with the present invention.
Figure 2:
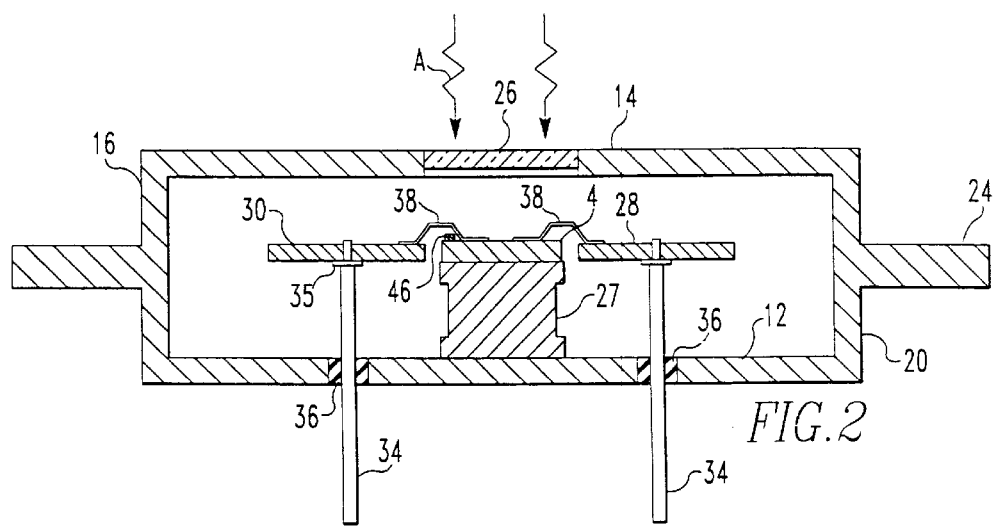
FIG. 2 is a section taken along lines II—II in FIG. 1.

A preferred embodiment of a radiation detector in accordance with the present invention is shown in FIGS. 1 and 2. A plurality of separate detector elements 2 is arranged on an upper surface of a detector substrate 4 in an interdigitated linear array. The detector substrate 4 preferably has a rectangular shape and the detector elements 2 are rectangular in shape and are arranged in a straight aligned array. In the interdigitated arrangement, each detector element 2 has an input terminal and an output terminal, with each detector element 2 positioned on the detector substrate 4 such that the input terminal of each detector element 2 is adjacent the output terminal of a detector element 2 immediately adjacent thereto and the output terminal of each detector element 2 is adjacent the input terminal of a detector element 2 immediately adjacent thereto. For ease of understanding, FIG. 1 shows only eight individual detector elements 2 deposited on the detector substrate 4. In actual practice, a large number of individual detector elements 2, such as sixty-four elements, would be included on the detector substrate 4. The input terminals of the odd numbered of the detector elements 2 as viewed in FIG. 1 are connected to common input terminal trace 6 extending along one side of the upper surface of the detector substrate 4. Similarly, the input terminals of the remaining or even numbered of the detector elements 2 as shown in FIG. 1 are connected to input terminal trace 8 extending along the opposite side of the upper surface of the detector substrate 4. The output terminal of each detector element 2 is connected to its own individual output trace on the upper surface of the detector substrate 4. For example, the last of the detector elements 2 shown in FIG. 1 has its output terminal connected to output trace 10.

The housing for the radiation detector of the present invention includes a bottom wall 12, top wall 14 and sidewalls 16, 18, 20 and 22 attached together to form a unitary, box-like structure. A mounting flange 24 extends completely around the exterior of the housing. A radiation transmitting window 26, such as a sapphire window, is positioned in an opening in the top wall 14 of the housing in about the midpoint thereof. Alignment devices, such as notches 25, can be provided in the mounting flange 24.

The detector substrate 4 is positioned with its lower surface on a thermoelectric cooler 27 or other cooler which, in turn, is supported by the bottom wall 12 of the housing. The cooler 27 has an upper surface at least as large as the detector substrate 4. The detector substrate 4 and cooler 27 are positioned beneath the radiation transmitting window 26 such that radiation, shown as reference A in FIG. 2, can pass through the window 26 and impinge upon the detector elements 2 on the upper surface of the detector substrate 4. It is preferred that the housing be sealed in a quasi-hermetic arrangement and that an inert atmosphere, such as dry argon, be provided in the interior of the housing.

In order to make electrical connection to the detector elements 2 on the detector substrate 4, a pair of preferably identical interconnect boards is positioned within the housing and adjacent the detector substrate 4 and generally aligned therewith. A first interconnect board 28 is positioned on one side of the detector substrate 4 and adjacent input terminal trace 6 and a second interconnect board 30 is positioned on the other side of the detector substrate 4 and aligned with input terminal trace 8. Each interconnect board 28, 30 includes a plurality of electrical interconnect traces 32 deposited on an upper surface thereof and each trace 32 is connected to an associated conductive connection pin 34 which extends through the bottom wall 12 of the housing and into appropriate terminals or holes in the interconnect boards 28, 30. The upper ends of the connection pins carry a flange 35 to support the interconnect boards 28, 30 with the flange 35 of the connection pin 34 contacting the lower surfaces of the interconnect boards 28, 30. The area where the connection pins 34 extend through the bottom wall 12 of the housing can be sealed with a glass-to-metal seal 36, such as a seal made of borosilicate glass. The interconnect boards 28, 30 can be made of ceramic materials such as alumina with conductive traces 32 deposited thereon.

A plurality of wire bonds 38, arranged in a single layer, connects between the appropriate traces 32 on the interconnect boards 28, 30 to the input and output terminals of the detector elements 2 on the detector substrate 4. Due to the interdigitated arrangement of the detector elements 2, the wire bonds 38 and traces 32 are substantially evenly divided on opposite sides of the detector substrate 4 and the wire bond 38 connections can be made to the detector substrate 4 without overlapping of the wire bonds 38. The wire bonds 38 can be formed of, for example, aluminum or gold.

In accordance with the present invention, electric power for the thermoelectric cooler 27 is provided through trace 40 and wire 41 on interconnect board 28 and through trace 42 and wire 43 on interconnect board 30. In addition, a chip thermistor 46 or other temperature sensing device is positioned on the upper surface of the detector substrate 4 and generally in the vicinity of the detector elements 2. Trace 48 extends along the upper surface of the detector substrate 4 from one terminal of the thermistor 46 to wire bond 49 and to trace 50 on interconnect board 28. Similarly, trace 52 extends on the upper surface of the detector substrate 4 from the other terminal of the thermistor 46 to wire bond 53 and trace 54 on interconnect board 30. The thermistor 46 is used to measure the temperature of the detector substrate 4 and for controlling, through external circuitry (not shown), the operation of the thermoelectric cooler 27 to maintain the detector substrate 4 at a desired, constant temperature. By using this controlled operation of a thermoelectric cooler 27, symmetric, stable and uniform cooling can be provided to the detector substrate 4.

Lead sulfide is preferably used for the individual detector elements 2 because this material exhibits very high sensitivity and low noise in the near infrared spectral range of from 1,000 nm to 2,500 nm. This radiation range has been found to be an appropriate spectral range for measurement of tissue constituents and all individual detector elements 2 are deposited at once, then separated using chemical etches. It is also preferred to use a thermally conductive material such as aluminum nitride as the material for the detector substrate 4.

Kovar is preferably used for the housing material and for the connection pins 34. Kovar is a known alloy formed of 53% iron, 17% cobalt and 29% nickel. Kovar is widely used as a housing material for electronics. Kovar can be easily machined and welded to form a hermetic or quasi-hermetic seal for the entire housing. Kovar can be plated with nickel alone or with a gold flash to enhance the welding and sealing discussed above. Dry argon is used as the internal atmosphere for the housing because it will not corrode internal parts, it provides some thermal isolation and it will not attenuate the radiation passing through the sapphire window 26.

In operation, the radiation in the form of light rays or photons, which will generally be sorted by wavelength, passes into the housing through the window 26 and strikes the detector elements 2. The electrical current generated when the radiation strikes the detector elements 2, under control of external circuitry not shown in FIGS. 1 and 2, generates an electrical signal from each individual detector element 2 which passes through one of the wire bonds 38, through a trace 32 on an interconnect board 28, 30 and to an individual connection pin 34. In this way, the radiation striking each detector element 2 is separated and each corresponding electrical signal is kept separated from other signals and from other detector elements 2.

By separating the interconnect boards 28, 30 from the detector substrate 4, good temperature isolation is provided such that the detector elements 2 can be maintained at a desired temperature through the use of the cooler 27. It is not necessary or desirable to additionally cool the interconnect boards 28, 30 which merely pass the generated signals to circuitry external of the invention shown in FIGS. 1 and 2. The thin wire bonds 38 between the interconnect boards 28, 30 and the detector substrate 4 only minimally affect the otherwise good temperature isolation between the interconnect boards 28, 30 and the detector substrate 4.

Having described above the presently preferred embodiments of the present invention, it is to be understood that the invention may be otherwise embodied within the scope of the appended claims.

We claim:

1. A radiation detector comprising:
  a) a plurality of separate detector elements arranged on an upper surface of a detector substrate in an interdigitated linear array, with each detector element having an input terminal and an output terminal, with each detector element positioned on the detector substrate such that the input terminal of each detector element is adjacent the output terminal of a detector element immediately adjacent thereto and the output terminal of each detector element is adjacent the input terminal of a detector element immediately adjacent thereto, b) a cooler attached to a lower surface of and supporting said detector substrate, c) a first interconnect board and a second interconnect board positioned on opposite sides of and spaced from said detector substrate, with each interconnect board carrying a plurality of separate electrical traces thereon, d) a sealed housing surrounding said detector substrate, said cooler, said first interconnect board and said second interconnect board, e) a radiation transmitting window in said housing and aligned with the detector elements on said detector substrate, f) a plurality of conductive pins extending through said housing and terminating at an appropriate electrical trace on said first and second interconnect boards, g) a temperature sensing means attached to said detector substrate for measuring the temperature of said detector substrate and for controlling the operation of said cooler to maintain the detector substrate at a desired temperature, and h) a single layer of wire bonds connecting appropriate traces on the interconnect boards to the input and output terminals of the detector elements, to the temperature sensing means and to the cooler.

2. The radiation detector of claim 1 wherein the temperature sensing means is a thermistor attached to the upper surface of said detector substrate.

3. The radiation detector of claim 1 wherein the cooler is a thermoelectric cooler.

4. The radiation detector of claim 1 wherein the input terminals of the detector elements adjacent the first interconnect board are each connected to a first input terminal trace on the detector substrate and a single wire bond extends between the first input terminal trace and a single electrical trace on the first interconnect board, and wherein the input terminals of the detector elements adjacent the second interconnect board are each connected to a second input terminal trace on the detector substrate and a single wire bond extends between the second input terminal trace and a single electrical trace on the second interconnect board.

5. The radiation detector of claim 1 wherein the detector substrate is made of aluminum nitride and the detector elements are made of lead sulfide.

6. The radiation detector of claim 1 wherein the radiation transmitting window is a sapphire window.

7. The radiation detector of claim 1 wherein the detector substrate has a rectangular shape and the detector elements are rectangular in shape and are arranged in a straight aligned array.

8. The radiation detector of claim 1, wherein the housing and the conductive pins are formed of a material substantially comprised of 53% iron, 17% cobalt and 29% nickel.

9. The radiation detector of claim 1 wherein the sealed housing has an argon atmosphere therein.

10. The radiation detector of claim 1 wherein an area where the conductive pins extend through the housing is closed with a glass-to-metal seal.

11. The radiation detector of claim 10 wherein the glass-to-metal seal is formed from borosilicate glass.

12. The radiation detector of claim 1 further including a mounting flange extending around and attached to the housing and having at least one alignment means therein.

13. The radiation detector of claim 1 wherein the interconnect boards are formed of a ceramic material.

* * * * *

UNITED STATES PATENT AND TRADEMARK OFFICE
CERTIFICATE OF CORRECTION

PATENT NO. : 6,107,630
DATED : August 22, 2000
INVENTOR(S) : John S. Mazurowski et al.

Page 1 of 1

It is certified that error appears in the above-identified patent and that said Letters Patent is hereby corrected as shown below:

Title page,
Item [60] RELATED TO U.S. APPLICATION DATA "1996" should read -- 1995 --.

Column 1,
Line 8, "1999" should read -- 1996 --.
Line 10, "1996" should read -- 1995 --.
Line 67, "presents" should read -- present --.

Claim 8,
Line 21, column 6, "1," should read -- 1 --.

Signed and Sealed this

Fourth Day of September, 2001

Attest:

NICHOLAS P. GODICI
Attesting Officer
Acting Director of the United States Patent and Trademark Office